United States Patent
Tamor et al.

[11] Patent Number: 5,518,780
[45] Date of Patent: May 21, 1996

[54] METHOD OF MAKING HARD, TRANSPARENT AMORPHOUS HYDROGENATED BORON NITRIDE FILMS

[75] Inventors: Michael A. Tamor, Toledo, Ohio; William C. Vassell, Bloomfield, Mich.

[73] Assignee: Ford Motor Company, Dearborn, Mich.

[21] Appl. No.: 261,278

[22] Filed: Jun. 16, 1994

[51] Int. Cl.$^6$ .................................................. B05D 3/06
[52] U.S. Cl. ........................ 427/573; 427/570; 427/561; 427/255.2
[58] Field of Search ................................. 427/573, 570, 427/561, 255.2

[56] References Cited

U.S. PATENT DOCUMENTS

| | | |
|---|---|---|
| 3,677,799 | 7/1972 | Hou . |
| 4,297,387 | 10/1981 | Beale . |
| 4,412,899 | 11/1983 | Beale . |
| 4,415,420 | 11/1983 | Beale . |
| 4,440,108 | 4/1984 | Little et al. . |
| 4,526,673 | 7/1985 | Little et al. . |
| 4,540,596 | 9/1985 | Nimmagadda . |
| 4,619,748 | 10/1986 | Moll et al. . |
| 4,622,236 | 11/1986 | Morimoto et al. . |
| 4,656,052 | 4/1987 | Satou et al. . |
| 4,657,774 | 4/1987 | Satou et al. . |
| 4,731,302 | 3/1988 | Weissmantel et al. . |
| 4,762,729 | 8/1988 | Hirano et al. . |
| 4,842,710 | 6/1989 | Freller et al. . |
| 4,944,961 | 7/1990 | Lu et al. . |
| 5,079,038 | 1/1992 | Rye . |
| 5,102,687 | 4/1992 | Pelletier et al. . |
| 5,135,808 | 8/1992 | Kimock et al. . |
| 5,175,020 | 12/1992 | Doellein et al. ......................... 427/569 |
| 5,316,804 | 5/1994 | Tomikawa et al. ..................... 427/569 |
| 5,350,605 | 9/1994 | Rostaing et al. ........................ 427/536 |

FOREIGN PATENT DOCUMENTS

| | | |
|---|---|---|
| 0450125A1 | 10/1991 | European Pat. Off. . |
| 61-149477 | 7/1986 | Japan . |
| 61-205383 | 9/1986 | Japan . |

OTHER PUBLICATIONS

Pierson, Handbook Of Chemical Vapor Deposition (CVD), Noyes Publications (1992) pp. 98–101.

S. Shanfield et al, "Ion Beam Synthesis Of Cubic Boron Nitride", 1983 American Vacuum Society, J. Vac. Sci. Technol. A1 (2), Apr.–Jun. 1983.

M. J. Paisley, et al "Boron Nitride Thin Films By Microwave ECR Plasma Chemical Vapor Deposition", Thin Solid Films, Nov. 25, 1993, Switzerland.

W. Halverson et al, "Effects Of Charge Neutralization On Ion–Beam–Deposited Boron Nitride Films", Journal Of Vacuum Science & TechnologyA (Vacuum, Surfaces, and Films), Nov.–Dec. 1985, USA, vol. 3, No. 6, ISSN 0734–2101, pp. 2141–2146.

M. Okamoto et al, "Formation Of Cubic Boron Nitride Film On Si With Boron Buffer Layers", Japanese Journal of Applied Physics, Part 1 (Regular Papers & Short Notes), 1990, Japan, vol. 29, No. 5, ISSN 0021–4922.

T. P. Smirnova et al, "Boron Nitride Films Prepared By Remote Plasma–enhanced Chemical Vapour Deposition From Borazine ($B_3 N_3 H_6$)", Thin Solid Films, Jan. 1, 1994, Switzerland.

(List continued on next page.)

*Primary Examiner*—Roy V. King
*Attorney, Agent, or Firm*—Lorraine S. Melotik; Roger L. May

[57] ABSTRACT

This invention is directed to a process for providing a hard, transparent, hydrophobic film of hydrogenated boron nitride on a substrate and the film so made. The process comprises depositing the film condensation from a flux of ions generated from gaseous precursors comprising borazine, the kinetic energy of the ions being between 50 and 300 electron volts per ion. Preferably the process is plasma-enhanced chemical vapor deposition carried out in a radio frequency plasma system.

8 Claims, 2 Drawing Sheets

OTHER PUBLICATIONS

F. Verinaud et al, "Investigations Of Hard BN Films Obtained By Ion Plating", Thin Solid Films, Mar. 15, 1992, Switzerland, vol. 209, No. 1, ISSN 0040-6090, pp. 59–66.

C. Weissmantel et al, "Preparation And Properties Of Hard i-C and i-BN coatings", *p. 42*, Thin Solid Films, 96 (1982) pp. 31–44.

O. Burat, et al, "Characterization And Growth Mechanisms Of Boron Nitride Films Synthesized By Ion–Beam–Assisted Deposition", Journal of Applied Physics, Sep. 15, 1990, USA, vol. 68, No. 6, ISSN 0021-8979, pp. 2780–2789.

C. Weissmantel, "Ion Beam Deposition Of Special Film Structures" *p. 184, right col., line 16 line 36*, American Vacuum Society, Detroit, MI, USA, Oct. 13–17, 1980, vol. 18, No. 2, ISSN 0022-5355, Journal of Vacuum Science And Technology, Mar. 1981, USA, pp. 179–185.

"Composition and Structure of Boron Nitride Films Deposited by Chemical Vapor Deposition from Borazine" J. Kouvetakis, V. V. Patel, C. W. Miller and D. B. Beach—, J. Vac. Sci. Technol. A, vol. 8, No. 6, Nov./Dec. 1990 pp. 3929–3933.

"Growth of Cubi Boron Nitride and Boron–Carbon–Nitride Coatings Using N–Trimethylborazine in an Electron Cyclotron Resonance Plasma Process"—A. Weber, U. Bringmann, R. Nikulski and C.–P. Klages Diamond and Related Materials, 2 (1993) pp. 201–206.

"A Sputter Model for Ion Induced Cubic Boron Nitride Growth", S. Reinke, M. Kuhr, R. Beckmann, W. Kulisch and R. Kassing, Institute of Technical Physics, University of Kassel, Germany 1994, pp. 283–289.

Diaglog Abstract of German Patent DD 2844075/ US 4,731, 302, 1994, p. 1.

METHOD OF MAKING HARD, TRANSPARENT AMORPHOUS HYDROGENATED BORON NITRIDE FILMS

FIELD OF THE INVENTION

This invention is directed to a process for providing a film comprising hydrogenated boron nitride (a-BN:H) on a substrate and the film so provided. More particularly, the process comprises depositing the a-BN:H film by condensation from a flux of ions generated from gaseous precursors including borazine, $B_3N_3H_6$, such as by plasma-enhanced chemical vapor deposition, under mild conditions including low power density.

BACKGROUND OF THE INVENTION

In the automotive industry, there has been a trend to manufacture more vehicle components from plastic. Plastics are corrosion resistant and lighter in weight than the metal components they replace, contributing to improved fuel economy. Glass components such as side- and backlights, might eventually be replaced by lighter, sound-absorbing plastics for reduced cost, improved fuel economy and reduced cabin noise. While numerous plastic materials are available to manufacture such components, some are less than desirable for such use since they lack the wear resistance desired for such components. It would be advantageous if the selection of plastic materials could be broadened.

One potential solution involves providing a protective film on such components which makes them more impervious to wear, including abrasion, and also chemical attack. To be readily commercialized, the films should be able to be deposited on the substrates at high rates, at the low temperatures required in working with plastics, from commercially available chemicals and by using conventional production equipment.

One of the primary objectives in research directed to diamond and other related wear resistant thin-film coatings is the development of completely transparent coatings which may be deposited at low temperatures. While thin polycrystalline diamond films are transparent and should provide the ultimate in protection from wear and corrosion, they can be deposited only at temperatures too high for most substrates of interest and generally require exacting post-deposition polishing to obtain good optical quality. Ion-beam or plasma-deposited amorphous hydrogenated carbon (also known as a-C:H or diamond like carbon) is sufficiently wear resistant and may be deposited at low temperature, but is optically too absorbent (deep red-brown) when deposited to useful thickness, i.e., to more than roughly 0.2 um. This coloration is due to the inclusion of graphitically bonded carbon in the otherwise transparent amorphous carbon-hydrogen network. Cubic boron-nitride (c-BN) is visibly transparent and is nearly as hard as diamond. However, as yet thin polycrystalline c-BN films have not been synthesized at a low temperature compatible with most substrates of interest. Reinke et al. in "*A Sputter Model for Ion Induced Cubic Boron Nitride Growth*", "Diamond Materials", p. 283–289, J. P. Dismukes and K. V. Ravi eds., (The Electrochemical Society, Pennington, N.J., 1993) describe that methods for synthesis of c-BN are generally characterized by (1) high substrate temperature (>200° C., usually over 400° C.), (2) intense activation of the precursor vapor (by not filament, radio frequency or microwave activation), and (3) use of separate boron- and nitrogen-containing precursors (boron-halides and ammonia, respectively). Although a pure, macrocrystalline c-BN phase has not yet been reliably demonstrated, the more successful methods involve electron-beam evaporation of boron metal or laser-ablation of h-BN into an intense nitrogen plasma. Such methods are unsuited to deposition over large areas at low temperatures.

Amorphous boron-nitride (a-BN) films have also been synthesized by sputtering techniques. Such previously prepared films are transparent or translucent, but are not particularly hard or wear-resistant, some even being subject to attack by atmospheric moisture. Sputtering is a form of physical vapor deposition in which atoms from a target material are dislodged by impact of a noble gas ion and directly transferred to the surface to be coated without intermediate interaction with the vapor. We believe that these prior a-BN films possess these undesirable wear-resistant characteristics because the processes of their formation encourage a high degree of $sp^2$ bonding in the film as in the hexagonal phase of boron-nitride (h-BN, analogous to graphite is quite soft). Such a-BN films are estimated to be at least 90% hexagonal.

Several investigators have attempted to form harder a-BN or a-BN:H coatings by means of chemical vapor deposition. These attempts have not met with success, we believe, because they do not include the deposition process conditions necessary to deposit films as disclosed in the present process, the resultant film comprising essentially stoichiometric boron nitride or nearly stoichiometric boron nitride. Our invention films comprise, we believe, a sufficient $sp^3$ fraction, estimated to be at least 20%, preferably at least 30%, still more preferably at least 40%, so as to impart useful wear resistant properties. Stoichiometry or near-stoichiometry (slightly boron rich) of the boron nitride films is required for transparency of the films and $sp^3$ bonding is required for hardness. For example, Kouvetakis and coworkers [J. Kouvetakis, V. V. Patel, C. W. Miller and D. B. Breach, J. Vac. Sci. Technol. A, v. 8, p. 3929 (1990)] evaluated several schemes for deposition of a-BN from borazine ($B_3N_3H_6$). Films deposited at 550° C. were thought to be highly non-stoichiometric, i.e, very boron rich, and were found to be entirely $sp^2$-bonded. Films deposited by a remote-plasma technique (where the object to be coated is not immersed in the plasma) were found to be stoichiometric with respect to B and N but were polycrystalline h-BN. Films deposited on the cathode of a parallel-plate plasma-reactor at 300° C. were also found to be stoichiometric but also largely h-BN, i.e, being $sp^2$ bonded. The deficiencies of films having these compositions were discussed above. Such films, deposited at lower temperatures, were non-adherent and unstable against attack by atmospheric moisture.

The present invention overcomes the deficiencies of the prior methods and provides a hard, transparent film comprising a-BN:H on various substrate materials including plastics. Desirably the present invention process used commercially available materials and conventional production equipment in depositing the film.

BRIEF DESCRIPTION OF THE INVENTION

The invention is directed to a process for providing a hard, transparent, film comprising amorphous hydrogenated boron nitride on a substrate. The process comprises the step of depositing the film on the substrate at a temperature less than about 200° C. by condensation from a flux of ions generated from gaseous precursors comprising borazine, the kinetic energy of the ions being between 50 and 300 electron volts (eV) per ion. Preferably, the gaseous precursors also comprise ammonia. The process may be carried out even at low temperatures below 100° C. as is desirable for many plastic substrates.

Preferably, deposition takes place by plasma-enhanced chemical vapor deposition in a radio frequency (RF) plasma deposition system maintained at a pressure less than 1 Torr, wherein the substrate is maintained at a potential of −150 and −900 volts relative to the plasma generated by the system.

According to another embodiment of the invention, it comprises the amorphous hydrogenated boron nitride film made according to the above disclosed process.

DESCRIPTION OF PREFERRED EMBODIMENTS

Figure 1:
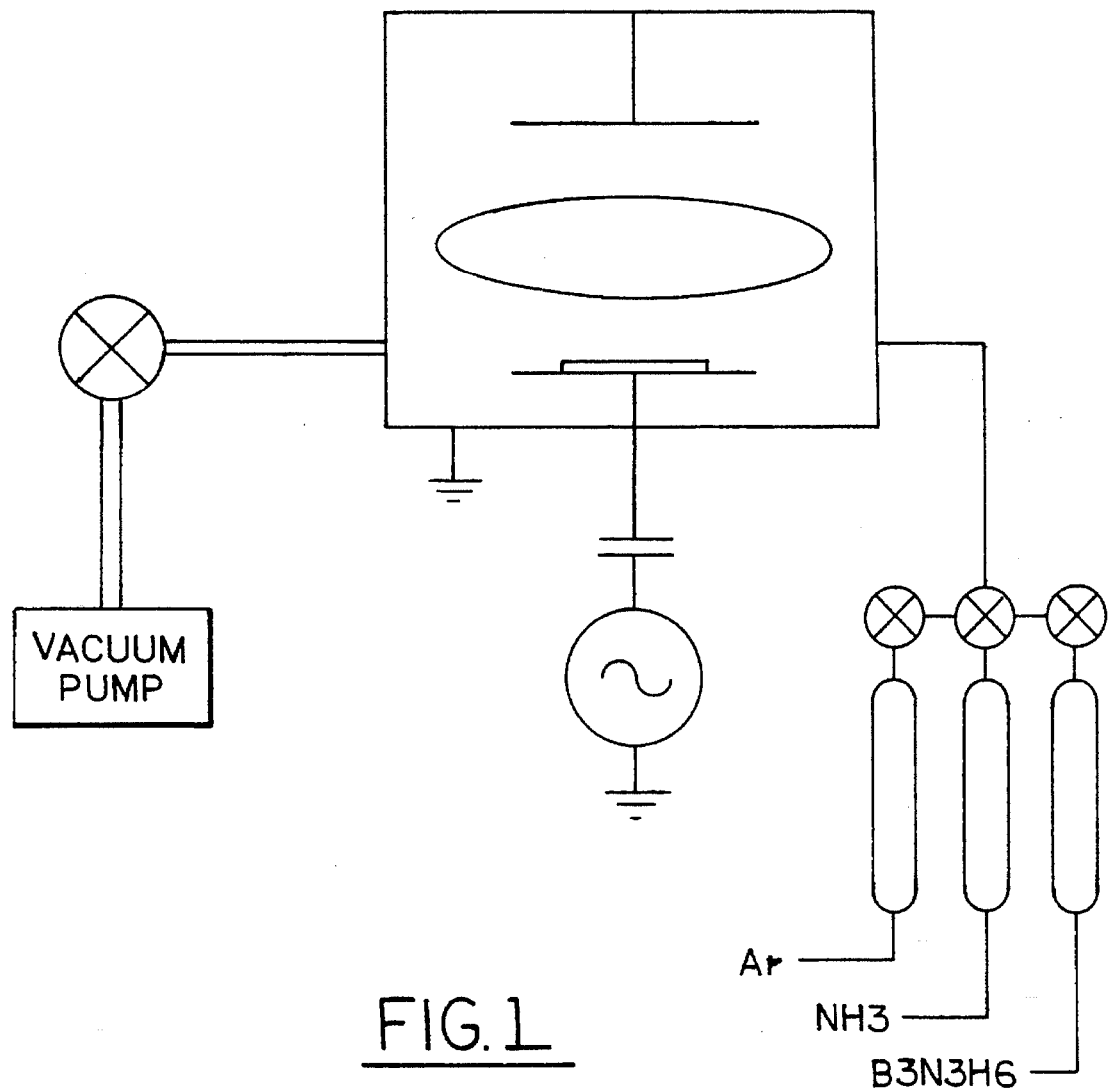
FIG. 1 is a schematic representation of an embodiment RF plasma deposition system useful in the invention process.

The process of this invention involves providing an amorphous film comprising hydrogenated boron nitride (a-BN:H) on a substrate. The film is slightly boron rich or essentially stoichiometric with respect to the B:N atomic ratio, the most desired value being about 1:1. While a-BN:H made according to this invention process may have a N:B atomic ratio of at least about 0.7:1, preferably this ratio is at least about 0.8:1, more preferably being at least about 0.9:1. Generally, these films are about 35 at % H. A more precise, but much more awkward, designation might be a-$(BN)_{(1-x)}H_x$ where x is preferably about 0.1 to 0.4. Such films are hard, transparent, and hydrophobic. They may be used to endow substrates including plastics like polycarbonate with improved abrasion and chemical resistance, which resistance has surprisingly been found to be equivalent or superior to that of glass. This invention is not, however, limited to applying the invention film to plastics. Other substrate materials might also benefit from an adherent film of a-BN:H made according to this invention. Exemplary of such substrates are glass, coatings on glass which may be well protected by an overlayer of the present invention a-BN:H, and any metal such as steel, aluminum, brass, and copper, to name but a few. Protective transparent a-BH:H films made according to the present invention have been deposited on substrates including glass and plastics and have proven impervious to deliberate abrasion by steel wool or emery paper (silicon-carbide grit). These present invention films are also highly hydrophobic such that water drops slide off leaving a dry surface.

According to the invention process, the deposition of the film is carried out by condensation from a flux of ions generated from gaseous precursors comprising borazine, the kinetic energy of the ions being between 50 and 300 electron volts (eV) per ion. As would be apparent to those skilled in the art in view of the present disclosure, an ion flux may suitably be generated from the precursors in various ways, including, ion beam and plasma, for example. Ion beam sources or plasma ion sources, e.g., may be employed to generate the ions from the gaseous precursors. Ion beam sources suitable for use in the present invention process include, but are not limited to, Kauffmann type ion beam sources. When employing ion beam sources, the precursors may be premixed and projected at a common energy from one gun, or passed through separate guns and thus projected at different energies if so desired. Exemplary of useful plasma ion sources are an electron-cyclotron-resonance (ECR) ion source or RF-induction plasma with beam grids for ion acceleration or with no grids and an RF potential to the substrate to provide acceleration. The latter embodiment essentially uses a secondary ion source to increase the ion flux in the original simple parallel-plate RF embodiment. Preferably, the deposition is carried out using plasma-enhanced chemical vapor deposition techniques as is described in the following paragraphs.

In the preferred process embodiment, deposition is carried out in a RF plasma deposition system. Plasma-enhanced chemical vapor deposition is a technique well known to those skilled in the art. A representative description of this technique as may be employed according to the present invention is discussed in "Films Deposition by Plasma Techniques," by M. Konuma (Springer-Verlag, Berlin, 1993), which reference is hereby expressly incorporated by reference for such teachings. As would be appreciated to those skilled in the art, the substrate on which the film is deposited in this preferred deposition embodiment is the RF-driven cathode of the reactor of the plasma deposition system. This deposition is carried out in a radio frequency (RF) plasma system maintained during deposition at a pressure less than 1 Torr, preferably less than about 0.1 Torr, most preferably between about 10 mTorr and 60 mTorr. Under increased total gas pressure, the film growth rates are increased.

Exemplary of a RF plasma deposition system which may be employed in the process of the invention is that shown schematically in FIG. 1. The reactor embodied therein is described as an RF-driven, capacitively-coupled, parallel plate reactor. The electrode to which RF-power is delivered develops a negative potential relative to the plasma and becomes the cathode. The preferred process described here is carried out with RF power delivered only to the electrode to which the substrate is mounted. Therefore the other electrode, the anode, is connected to ground potential. The metal chamber also can be used as the grounded anode. For conducting substrates even the cathode plate may be omitted and the RF-power delivered directly to the substrate, effectively making it the cathode itself. During the deposition process, the substrate has a RF induced bias of between about −150 and −900 volts, more preferably between about −200 and −600 volts. This RF system, or others used according to the invention, is preferably maintained during film deposition at a power density (ion impact energies on the substrate) between about 0.5 w/cm$^2$ and 3 w/cm$^2$. The power density on the substrate during deposition according to the present invention is optimally generally less than about 2 watts/cm$^2$. The RF power in the preferred embodiment process is generally varied to induce substrate bias voltages (relative to the plasma, so determining the ion impact energy). The ion impact energy is generally roughly ⅓ the RF bias voltage. The actual mean ion impact energy on the growing film depends both on the bias voltage and the pressure and composition of the feed-gas. For typical growth conditions under pressures less than roughly 50 milliTorr, ions undergo few collisions in traversing the potential drop between the plasma and the substrate, and the mean energy is typically one-half to one-third the bias voltage. Thus the optimal ion impact energy (kinetic energy of the ions) is in the range 50 to 300 eV per ion. At higher pressures collision become more frequent and the impact energy is somewhat reduced. As the bias voltage is related to the ionization fraction of the plasma, increased bias voltage correlates with increased ion density, ion flux, and therefore deposition rate. Increasing the bias voltage on the substrate during deposition increased the film growth rate. In this preferred invention embodiment process, as discussed above, the potential is induced by radio-frequency-induced self-bias of the cathode on which the substrate is mounted. Alternatively, if the substrate to be provided with the film is itself an electrical conductor, it may be used as the cathode by applying the RF power directly to it.

Prior to providing a film of a-BN:H on the substrate according to the invention process, the substrate surfaces are often prepared by any number of methods such as grinding, polishing, chemical etching, and ultrasonic degreasing. In all cases where this is done, the method or combination of methods used is determined by the substrate material. After surface preparation, the substrate may placed into a system reaction chamber which is then evacuated, to a pressure, e.g., of about $5 \times 10^{-6}$ Torr. This initial evacuation pressure is not critical since films can be deposited over a wide range of initial pressures.

According to an optional next step, adsorbed contaminates are preferably removed from the substrate surfaces by bombardment with ions, e.g., argon ions. These may be formed by introducing argon gas into a reaction chamber and initiating a plasma discharge. For this decontamination procedure, the substrate is generally biased at about −100 to −500 volts. This optional step can be carried out from generally a few minutes to about 20–30 minutes depending on the degree of surface contamination assumed.

In order to carry out the invention process, gaseous precursor(s) are employed to form the film. The precursors may consist essentially of borazine or include other gaseous materials, such as ammonia. When ammonia is employed along with the borazine, as is preferred, the molar ratio of ammonia to borazine may vary widely, preferably being at least 1:1, but not exceeding 5:1. Hydrocarbons like methane, diethylsilane, or mixtures thereof may also be included with the borazine and the optional ammonia in the present method. The addition of carbon-containing species such as methane allows formation of films with arbitrary composition intermediate between a-BN:H and a-C:H. The inevitable inclusion of $sp^2$-bonded carbon results in reduced transparency, however, and hence preferably, the use of such carbon-containing species is limited to small amounts or excluded.

Flow rates of the gaseous precursors, as may be employed into the preferred RF system embodiment described above, may be varied over a wide range while practicing the present invention. Typical flow rates are in the range of 1 to 30 sccm or more. The chosen flow rate is dictated by the area of the object to be coated and the deposition rate generated by the chosen ion flux generating (plasma) conditions. Larger reactors and higher deposition rates require higher flow rates.

Under the mild deposition conditions employed in this invention process, it is believed that the chemical bonding configuration of the precursor gases tend to be preserved in the film grown from them. That is, the low pressures and low power densities of our process, such as with the RF plasma system, generate such mild conditions that very little chemical reaction of the precursors occurs in the vapor and with the preferred RF process the plasma serves essentially as an ion-source. Since boron and nitrogen are "pre-bonded" in the proper stoichiometry, the mild conditions of the invention process maintain this stoichiometry in the deposited film. The films produced according to the invention were found to contain a sufficiently high degree of $sp^3$ (fourfold) atomic coordination in combination with a sufficiently low content of hydrogen, so as to be very hard and wear resistant, unlike most amorphous BN films which are largely $sp^2$ (threefold) coordinated, as in hexagonal boron-nitride (h-BN), and are much softer. Maximal hardness appears to be related to maximization of unhydrogenated $sp^3$ bonding. The films of this invention often have hardness of at least 8 GPa, more preferably between about 9 and 30 GPa.

Determination of the bonding was carried out by X-ray Photoelectron Spectroscopy (XPS). XPS confirmed that (1) both the boron and the nitrogen are largely $sp^3$ coordinated, and (2) the boron is mainly bonded to nitrogen and vice-versa. The configurations (the identity of atoms adjacent to a given atom) are similar to those of cubic boron-nitride ($sp^3$ bonded boron surrounded by $sp^3$ nitrogen and vice-versa). This should not be confused with crystalline ordering where both the identity and position of neighboring atoms are periodic and predictable to a considerable distance. This last is by definition impossible in an amorphous material. The XPS features are broad compared with those exhibited by the crystalline reference materials, indicating an amorphous structure and within the precision of XPS, roughly 10%, these films are stoichiometric or nearly stoichiometric (slightly boron rich).

We have found that in order to suppress thermal annealing which leads to formation of undesirable h-BN atomic configurations, during deposition according to the present invention process the substrate temperature must be kept lower than about 200° C. The ability to deposit films at relatively low substrate temperatures (less than 200° C.) as embodied in the present invention process is conveniently compatible with the requirement that plastics not be heated over roughly 100° C. Where the thermal conductivity of the substrate is poor or active cooling by internal flow of water or gas is impossible, the energy flux delivered from the plasma must be limited to prevent overheating. This may require that the growth rate be reduced. Thus it may be found that metals may be coated at a higher rate than plastics. The particular temperature of the system during the deposition process is not critical, as long as it is kept below about 200° C. For deposition on most conventional plastics, it will generally be less than 100° C. One advantage of the invention process is that it can be carried out at low temperatures as would be necessary when the substrate is plastic. As would be apparent to those skilled in the art in view of this disclosure, the substrate and other considerations including the particular system employed will suggest allowable and optimal operating temperatures. The physical properties, e.g., hardness, of the a-BN:H films made according to the present invention may desirably be varied by changing the composition and/or ratios of the precursor gases, and e.g., by varying the substrate bias voltage in the RF embodiment process. For example, addition of ammonia to borazine in the molar ratio of 1:1 increases the optical gap ($E_g$) from 2.5 eV to 3.5 ev as shown in the following table of films made according to the present invention process. The films in the table were produced using preferred RF plasma enhanced CVD. A combination of borazine and methane as precursors reproduces films with an $E_g$ of 1.4 eV. Optical gap is related to the transparency of the film. Transparency of the films can be varied over a wide range without compromising hardness of the resultant film as has been confirmed by nano-indentation measurements and as is shown in the table.

TABLE

| FILM COMPOSITION | THICKNESS | HARDNESS | OPTICAL GAP | DENSITY |
|---|---|---|---|---|
| 100% Borazine | 4.13 uM | 9 GPa | 2.5 eV | 2.03 g/cm$^3$ |
| 1 Borazine<br>1 NH$_3$ (ammonia) | 4.6 uM | 10.8 GPa | 3.5 eV | 2.14 g/cm$^3$ |
| 1 Borazine<br>1 NH$_3$<br>1 CH$_4$ (methane) | 3.7 uM | 10.5 GPa | 2.7 eV | 1.77 c/cm$^3$ |
| 1 Borazine<br>1 NH$_3$<br>1 Si(C$_2$H$_6$)$_2$ (diethylsilane) | 6.6 uM | 13.1 GPa | 1.9 eV | 2.14 g/cm$^3$ |
| 1 Borazine<br>1 CH$_4$ | 3.5 uM | 11.1 GPa | 1.4 eV | 1.69 g/cm$^3$ |

Figure 2A:
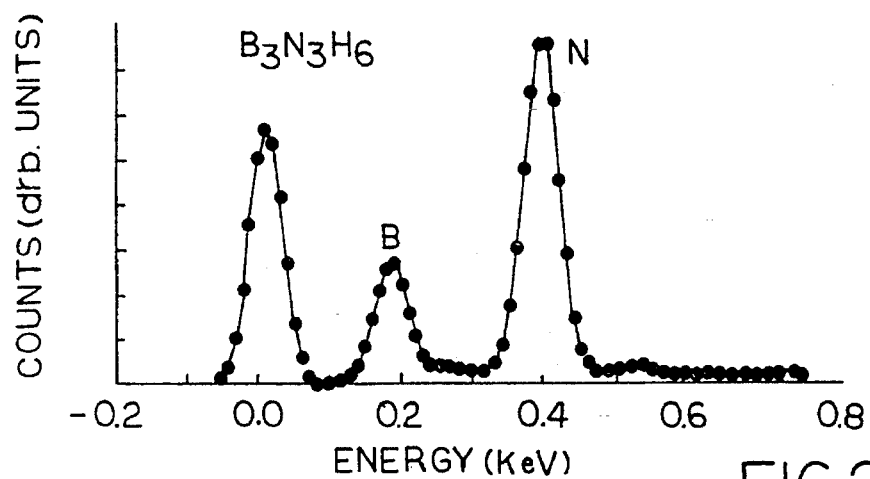
FIGS. 2(a), 2(b) and 2(c) show EDS spectra of various boron nitride films, the films of FIGS. 2(a) and 2(b) being embodiments of the present invention.
Figure 2B:
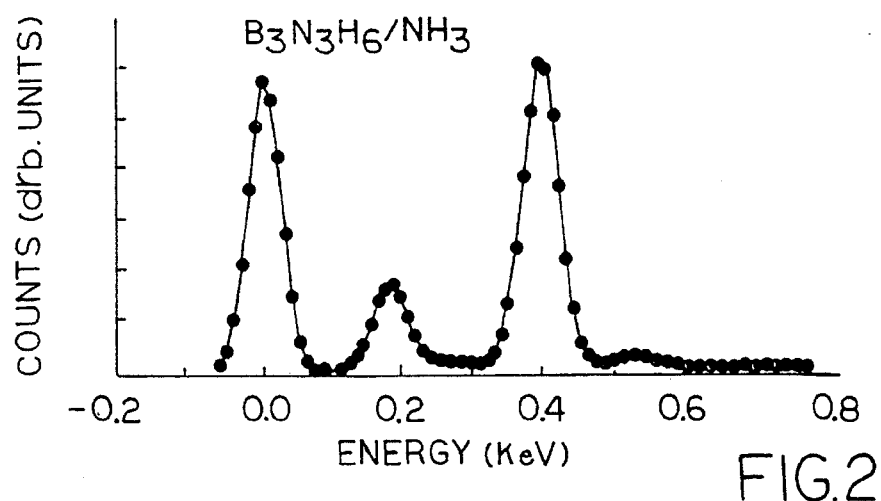
Figure 2C:
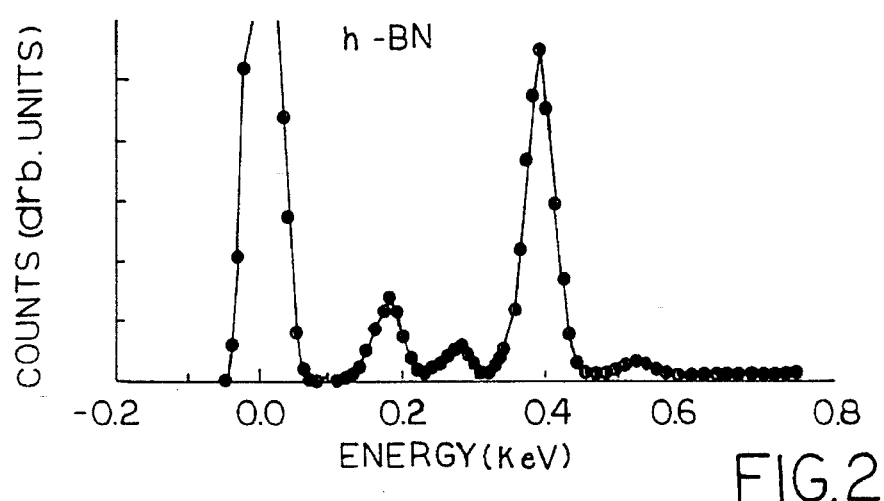

In the second example of the above table employing a molar ratio of borazine to ammonia of 1:1, the flow rate of each of the gases was 10 sccm and the total system pressure was 50 mT. As seen from the table, it resulted in a clear transparent film with a hardness of 10.8 GPa (10.8×10$^9$ pascals). This compares favorably with amorphous hydrogenated carbon coatings (11.8 GPa). In this case, with a substrate bias of −900 volts, the deposition rate was generally about 4 uM/hr (micrometers/hour). The resulting films in the table were shown to be essentially stoichiometric BN as determined by XPS (X-ray Photoelectron Spectroscopy). Although it is not truly quantitative because of matrix effects (variations in the fluorescence intensity of a given atom depending on its environment), Energy Dispersive X-Ray Analysis (EDS) can be used to illustrate the effect of ammonia addition. FIG. 2a shows the EDS spectra of a film deposited from pure borazine while 2b is from 1:1 molar borazine/ammonia mixture, both films being made according to embodiments of the present invention. FIG. 2c, for comparison, is an EDS spectra of a commercial h-BN specimen. The B:N ratio of the a-BN:H films can be estimated by comparison of the ratio of the areas of the respective x-ray fluorescence peaks of boron (B) and nitrogen (N) to that of the h-BN comparative standard. Without ammonia being included with borazine as precursors during film formation, the resultant a-BN:H film is slightly deficient in nitrogen yielding an estimated N/B atomic ratio of 0.72. However, use of ammonia in addition to borazine as precursors (1:1 molar ratio) increases the N/B ratio of the vapor slightly from 1:1 to 1.33:1, increases the estimated N/B ratio of the film to 0.88, which optimally makes it much harder and more transparent (as shown in the Table). Further increasing the ammonia:borazine precursor molar ratio to 2:1 and 3:1 results in further improvement in transparency. This improvement is noticeable only in thick films and then only in side-by-side comparison to an uncoated substrate. Increase in the ammonia:borazine molar ratio to 3:1 increases hardness only slightly. However, further increasing this ratio of precursors to 5:1 results in a much softer film, indicating the most optimal molar range of ammonia:borazine precursors to be from 1:1 to roughly 4:1. It is believed that use of an excessively high ammonia:borazine ratio, i.e., significantly above 5:1, results in the undesirable incorporation of dangling NH$_2$ groups in the resultant film. While incorporation of these dangling groups does increase the relative N fraction and give the appearance of improved stoichiometry, they cannot contribute to the rigidity of the amorphous network of which the film is composed and so actually degrade its hardness. These results clearly demonstrate that the use of supplemental nitrogen precursor in the form of ammonia increases the nitrogen content of the film and is useful to maintain B:N stoichiometry closer to essentially stoichiometric, which is most desirable for optimal physical properties such as ultimate hardness and transparency. Nonetheless, other films including the slightly boron rich films made according to the present invention process as with only borazine precursors (i.e., without any ammonia) are still very hard and suitably transparent for use to provide coatings as described herein. The refractive index of a-BN:H made according to the present invention process is suitable to avoid objectionable reflections when the film is applied on glass and plastic substrates.

We claim:

1. A process for providing a hard, transparent film comprising amorphous hydrogenated boron-nitride on a substrate, said process comprising depositing said film on said substrate at a temperature of less than about 100° C. by plasma-enhanced chemical vapor deposition from gaseous precursor materials comprising ammonia and borazine in a molar ratio between about 1:1 and 5:1 in a radio frequency plasma system maintained at a pressure less than 1 Torr, said substrate being maintained at a potential of between −150 and −900 volts relative to the plasma generated by the system.

2. The process according to claim 1, wherein said a-BN:H comprises a N:B atomic ratio of at least about 0.7:1.

3. The process according to claim 1, wherein said a-BN:H comprises a B:N atomic ration of about 1:1.

4. The process according to claim 1, wherein said substrate comprises materials selected from the group consisting of glass, plastic, and metal.

5. The process according to claim 1, wherein said film has an optical gap of at least about 2.5 eV.

6. The process according to claim 1, wherein the ions generated have impact energies on said substrate of less than about 3 watts/cm$^2$.

7. The process according to claim 1, wherein said film has a hardness of at least about 8 GPa.

8. The process according to claim 1, wherein during deposition the system is maintained at a power density between 0.5 w/cm$^2$ and 3 w/cm$^2$.

* * * * *